US012572176B2

(12) United States Patent
Ryu et al.

(10) Patent No.: US 12,572,176 B2
(45) Date of Patent: Mar. 10, 2026

(54) DISPLAY DEVICE

(71) Applicant: Samsung Display Co., LTD., Yongin-si (KR)

(72) Inventors: Su Chang Ryu, Yongin-si (KR); Sung Guk An, Yongin-si (KR); Hyeong-Jun Kim, Yongin-si (KR); Suk Ho Choi, Yongin-si (KR); Jung Kyu Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 191 days.

(21) Appl. No.: 18/598,446

(22) Filed: Mar. 7, 2024

(65) Prior Publication Data

US 2025/0060786 A1     Feb. 20, 2025

(30) Foreign Application Priority Data

Aug. 17, 2023    (KR) ........................ 10-2023-0107657

(51) Int. Cl.
  *G06F 1/16*         (2006.01)
  *H01L 25/075*       (2006.01)
(52) U.S. Cl.
  CPC ........ *G06F 1/1652* (2013.01); *H01L 25/0753* (2013.01)
(58) Field of Classification Search
  CPC combination set(s) only.
  See application file for complete search history.

(56) References Cited

U.S. PATENT DOCUMENTS

| | | | | | |
|---|---|---|---|---|---|
| 9,627,463 | B2 * | 4/2017 | Kwon | .................. | H10K 77/111 |
| 9,985,086 | B2 * | 5/2018 | Kwon | .................. | H10K 59/131 |
| 12,001,245 | B2 * | 6/2024 | Kishimoto | ........... | G06F 3/0412 |
| 12,339,705 | B2 * | 6/2025 | Shin | .................. | H04M 1/0216 |
| 2015/0382446 | A1 * | 12/2015 | Kwon | .................. | G06F 1/1643 |
| | | | | | 174/251 |
| 2016/0155788 | A1 * | 6/2016 | Kwon | .................. | H10K 59/124 |
| | | | | | 257/40 |
| 2016/0336523 | A1 * | 11/2016 | Kwon | ................... | H10K 59/87 |
| 2017/0179215 | A1 * | 6/2017 | Kwon | .................. | H10K 77/111 |
| 2021/0280828 | A1 | 9/2021 | Kim et al. | | |

(Continued)

FOREIGN PATENT DOCUMENTS

| | | |
|---|---|---|
| KR | 10-2016-0130921 | 11/2016 |
| KR | 10-2017-0047713 | 5/2017 |

(Continued)

OTHER PUBLICATIONS

International Search Report corresponding to International Application No. PCT/KR2024/011585 dated Nov. 15, 2024.

*Primary Examiner* — Lisa Lea-Edmonds
(74) *Attorney, Agent, or Firm* — Lerner David LLP

(57)               ABSTRACT

A display device includes a substrate that includes a display area and a non-display area, a display layer disposed on the substrate and overlapping the display area, and a support plate disposed under the substrate. The support plate includes a first region disposed on a rear surface of the display layer, a second region connected to the first region and including a lattice pattern, and a third region connected to the second region and disposed on a rear surface of the first region. The second region is bent and overlaps a bending area of the non-display area of the substrate.

20 Claims, 17 Drawing Sheets

(56)          References Cited

U.S. PATENT DOCUMENTS

2023/0104812 A1      4/2023  Wang et al.
2025/0060786 A1*     2/2025  Ryu ..................... G06F 1/1652

FOREIGN PATENT DOCUMENTS

KR      10-2017-0084402       7/2017
KR      10-2017-0091587       8/2017
KR      10-2017-0137984      12/2017
KR      10-2019-0078842       7/2019
KR      10-2021-0086285       7/2021
KR      10-2022-0084189       6/2022

* cited by examiner

DISPLAY DEVICE

CROSS-REFERENCE TO RELATED APPLICATION(S)

This application claims priority to and benefits of Korean Patent Application No. 10-2023-0107657 under 35 U.S.C. § 119, filed on Aug. 17, 2023, at the Korean Intellectual Property Office, the entire contents of which are incorporated herein by reference.

BACKGROUND

1. Technical Field

Embodiments relate to a display device with a bendable area.

2. Description of the Related Art

The display device may include pixels and display an image on a display screen by controlling the brightness of each pixel. The display device may include a touch sensing unit capable of sensing a user's touch. The display device may include a display panel on which pixels are formed. The touch sensor may be provided on the display panel. For example, the display panel may include a touch sensing unit, or a panel including the touch sensing unit may be attached to the display panel.

The display device may include a flexible printed circuit board that transmits signals for driving the pixels and signals for driving the touch sensing unit to the display panel.

SUMMARY

The embodiments provide a display device including a substrate having a bendable area and capable of improving shock resistance in the bendable area of the substrate.

However, embodiments are not limited to those set forth herein. The above and other embodiments will become more apparent to one of ordinary skill in the art to which the disclosure pertains by referencing the detailed description of the disclosure given below.

According to an embodiment, the display device may include a substrate including a display area and a non-display area, a display layer disposed on the substrate and overlapping the display area, and a support plate disposed under the substrate, the support plate may include a first region disposed on a rear surface of the display layer, a second region connected to the first region and including a lattice pattern, and a third region connected to the second region and disposed on a rear surface of the first region, and the second region may be bent and may overlap a bending area of the non-display area of the substrate.

The bending region of the substrate and the second region of the support plate may not be coupled to each other.

The bending area of the substrate and the second region of the support plate may be spaced apart from each other.

The display device may further include an adhesive layer disposed between the first region of the support plate and the substrate and between the third region of the support plate and the substrate.

The display device may further include a buffer layer disposed between the first region and the third region of the support plate.

The first region, the second region, and the third region of the support plate may have a same thickness.

A thickness of the second region of the support plate may be smaller than a thickness of the first region of the support plate.

A thickness of the third region of the support plate may be smaller than a thickness of the first region of the support plate.

The thicknesses of the second region and the third region of the support plate may be the same as each other.

In a state of which the support plate is unfolded, an upper surface of the second region of the support plate may be coplanar with upper surfaces of the first region and the third region of the support plate.

In a state of the support plate is unfolded, a lower surface of the second region of the support plate may be coplanar with lower surfaces of the first region and the third region of the support plate.

The display device may further include an auxiliary buffer layer disposed between the substrate and the second region of the support plate.

A display device according to an embodiment may include a substrate including a display area and a non-display area, a display layer disposed on the substrate and overlapping the display area, and a support plate disposed under the substrate, wherein the support of the plate may include a first region disposed on a rear surface of the display layer, a second region connected to the first region and including a lattice pattern, and a second region connected to the second region and disposed on a rear surface of the first region, and a third region connected to the second region and disposed on a rear surface of the first region, the first region of the support plate and the substrate may be coupled by an adhesive layer, the third region of the support plate and the substrate may be coupled by the adhesive layer, and a separation space may be disposed between the second region of the support plate and the substrate.

The display device may further include a buffer layer disposed between the first region and the third region of the support plate.

The first region, the second region, and the third region of the support plate may have a same thickness.

A thickness of the second region of the support plate may be smaller than a thickness of the first region of the support plate.

A thickness of the third region of the support plate may be smaller than a thickness of the first region of the support plate.

Thicknesses of the second region and the third region of the support plate may be the same as each other.

In a state in which the support plate is unfolded, an upper surface of the second region of the support plate may be coplanar with upper surfaces of the first region and the third region of the support plate.

In a state in which the support plate is unfolded, a lower surface of the second region of the support plate may be coplanar with lower surfaces of the first region and the third region of the support plate.

According to embodiments, a display device may include a bendable area and may be capable of improving shock resistance in the bendable area.

DETAILED DESCRIPTION OF THE EMBODIMENTS

Figure 1:
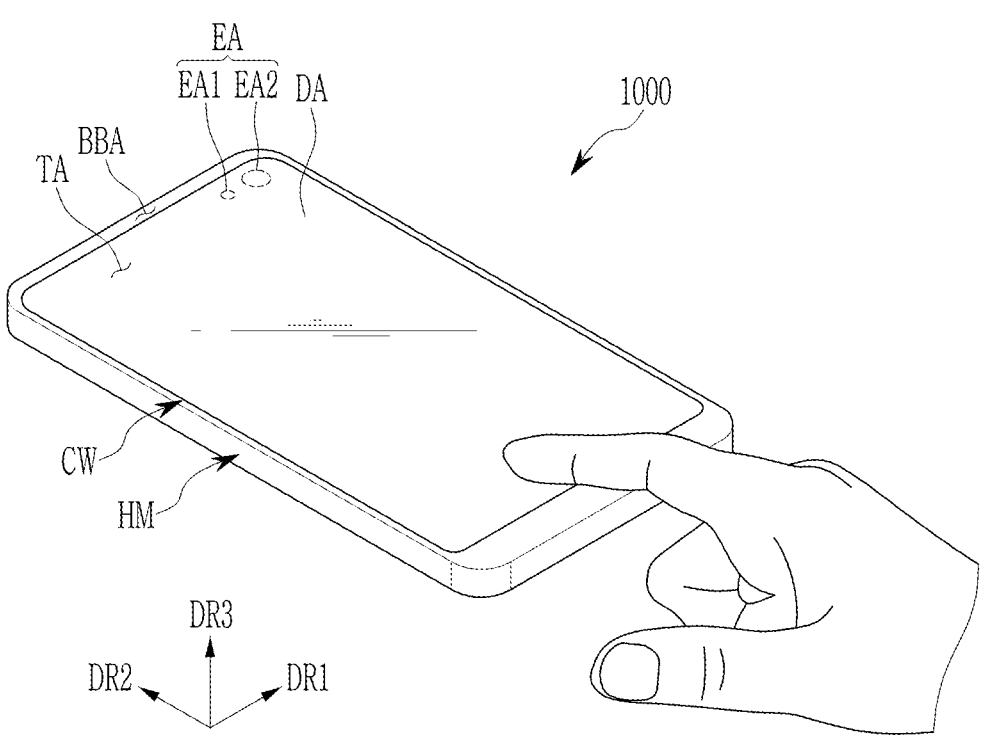
FIG. 1 is a schematic perspective view illustrating a use state of a display device according to an embodiment.

In the following description, for the purposes of explanation, numerous specific details are set forth in order to provide a thorough understanding of various embodiments or implementations of the invention. As used herein, "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element or a layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the axis of the first direction DR1, the axis of the second direction DR2, and the axis of the third direction DR3 are not limited to three axes of a rectangular coordinate system, such as the X, Y, and Z-axes, and may be interpreted in a broader sense. For example, the axis of the first direction DR1, the axis of the second direction DR2, and the axis of the third direction DR3 may be perpendicular to one another, or may represent different directions that are not perpendicular to one another. For the purposes of this disclosure, "at least one of A and B" may be understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, a schematic structure of the display device will be described through FIGS. 1 and 2.

Figure 2:
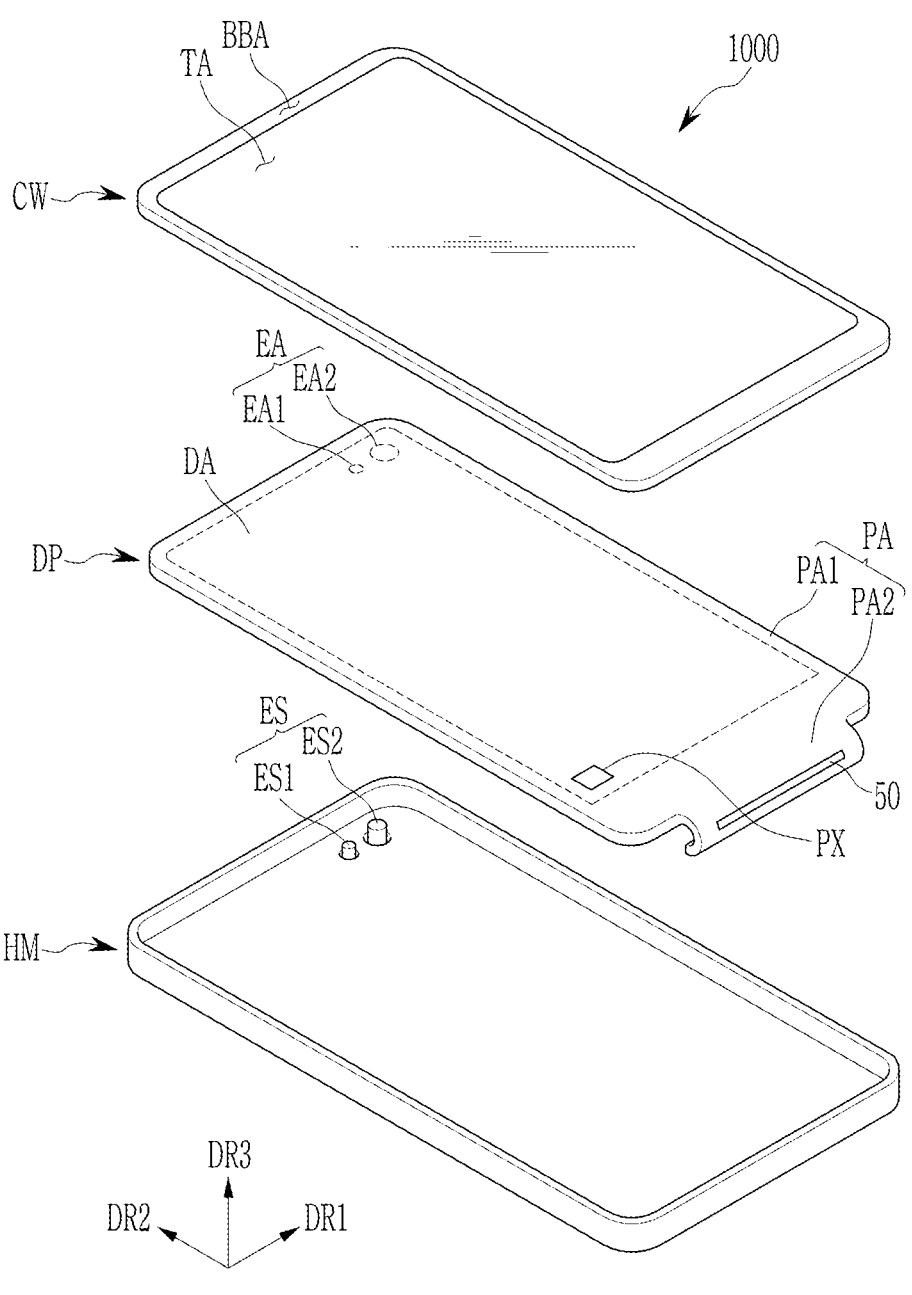
FIG. 2 is an exploded schematic perspective view of a display device according to an embodiment.

FIG. 1 is a schematic perspective view illustrating a use state of a display device 1000 according to an embodiment, and FIG. 2 is an exploded schematic perspective view of the display device 1000 according to an embodiment.

Referring to FIG. 1, the display device 1000 according to an embodiment may be a device that displays videos or still images, and may be used as a display screen for various products such as mobile phones, smartphones, tablet PCs, mobile communication terminals, electronic notebooks, e-books, portable multimedia players (PMPs), navigation, ultra mobile personal computers (UMPCs), as well as televisions, laptops, monitors, billboards, and the Internet of Things (IOT).

For example, the display device 1000 according to an embodiment may be a wearable device such as a smart watch, a watch phone, a glasses-type display, and a head mounted display (HMD).

For example, the display device 1000 according to an embodiment may include a dashboard of a vehicle, a center information display (CID) disposed on a center fascia or dashboard of a vehicle, and a room mirror display as a replacement for a side mirror of a vehicle, entertainment for the back seat of a car, and may be used as a display disposed on the back of the front seat. FIG. 1 illustrates that the display device 1000 is used as a smart phone for convenience of explanation.

The display device 1000 may display an image in a third direction DR3 on a display surface parallel to each of the first and second directions DR1 and DR2. The display surface on which the image is displayed may correspond to the front surface of the display device 1000 and may correspond to the front surface of the cover window CW. The image may include a still image as well as a dynamic image.

In an embodiment, front (or upper surface) and the rear surface (or lower surface) of each member are defined based on the direction in which the image is displayed. The front surface and the rear surface may be opposite to each other in the third direction DR3, and a normal direction of each of the front surface and the rear surface may be parallel to the third direction DR3. The separation distance between the front and rear surfaces in the third direction DR3 may correspond to the thickness of the display panel in the third direction DR3.

The display device 1000 according to an embodiment may detect a user's input (refer to a hand in FIG. 1) applied from the outside. The user's input may include various types of external inputs, such as a part of the user's body, light, heat, or pressure. In an embodiment, the user's input is shown as the user's hand being applied to the front surface of the display device 1000. However, embodiments are not limited thereto. A user's input may be provided in various forms, and the display device 1000 may detect a user's input applied to the side or rear surface of the display device 1000 according to the structure of the display device 1000.

Referring to FIGS. 1 and 2, the display device 1000 may include a cover window CW, a housing HM, a display panel DP, and an optical element ES. In an embodiment, the cover window CW and the housing HM may be combined to form the exterior of the display device 1000.

The cover window CW may include an insulating panel. For example, the cover window CW may be made of glass, plastic, or a combination thereof.

The front surface of the cover window CW may define the front surface of the display device 1000. The transmission area TA may be an optically transparent area. For example, the transmission area TA may have visible light transmittance of about 90% or more.

The blocking area BBA may define the shape of the transmission area TA. The blocking area BBA may be adjacent to the transmission area TA and surround the transmission area TA. The blocking area BBA may have relatively low light transmittance compared to the transmission area TA. The blocking area BBA may include an opaque material that blocks light. The blocking area BBA may have a certain color. The blocking area BBA may be defined by a bezel layer provided separately from the transparent substrate defining the transmission area TA, or may be defined by an ink layer inserted into or colored in the transparent substrate.

The display panel DP may include a display pixel PX displaying an image and a driving unit 50, and the display pixel PX may be disposed in the display area DA and the component area EA. The display panel DP may include a front surface including a display area DA and a non-display area PA. In an embodiment, the display area DA and the component area EA may be areas where an image is displayed using pixels, and may be areas where an external input is sensed using a touch sensor positioned above the pixels in the third direction DR3.

The transmission area TA of the cover window CW may at least partially overlap the display area DA and the component area EA of the display panel DP. For example, the transmission area TA may overlap the entire surface of the display area DA and the component area EA, or may overlap at least a portion of the display area DA and the component area EA.

Accordingly, the user may view the image through the transmission area TA or provide an external input based on the image. However, embodiments are not limited thereto. In another example, an area where an image is displayed and an area where an external input is sensed may be separated from each other.

The non-display area PA of the display panel DP may at least partially overlap the blocking area BBA of the cover window CW. The non-display area PA may be an area covered by the blocking area BBA. The non-display area PA may be adjacent to the display area DA and may surround the display area DA. An image may not be displayed in the non-display area PA, and a driving circuit and/or a driving wire for driving the display area DA may be disposed in the non-display area PA. The non-display area PA may include a first non-display area PA1 disposed outside the display area DA and a second non-display area PA2 including the driving unit 50, connection wires, and a bending area BA. In the embodiment of FIG. 2, the first non-display area PA1 may be disposed on sides (e.g., three sides) of the display area DA, and the second non-display area PA2 may be disposed on the remaining side of the display area DA.

A part of the non-display area PA of the display panel DP may be bent. For example, some of the non-display area PA may face the back of the display device 1000. Thus, the blocking area BBA, which is shown on the front of the display device 1000 in FIG. 2, may be reduced and minimized. For example, the second non-display area PA2 may be assembled after being bent and positioned on the back of the display area DA.

For example, the component area EA of the display panel DP may include a first component area EA1 and a second component area EA2. The first component area EA1 and the second component area EA2 may be at least partially surrounded by the display area DA. The first component area EA1 and the second component area EA2 are illustrated as being spaced apart from each other. However, embodiments are not limited thereto. For example, the first component area EA1 and the second component area EA2 may be connected to each other at least in part. The first component area EA1 and the second component area EA2 may be areas in/below which an optical element (see ES of FIG. 2; hereinafter referred to as a component), which operates using infrared light, visible light, or sound, is disposed.

The display area DA (hereinafter also referred to as the main display area) and the component area EA may include light emitting diodes and pixel circuit units. The light emitting diodes may emit light according to current that is generated and controlled by the pixel circuit units. For example, one light emitting diode and one pixel circuit part are referred to as a pixel PX. One pixel circuit unit and one light emitting diode may be formed one-to-one in the display area DA and the component area EA.

The first component area EA1 may include a display layer including pixels and a transmission portion. For example, light or/and sound may pass through the transmission portion. The transmission portion may be positioned between adjacent pixels and may be composed of layers that transmit light and/or sound. According to embodiments, a layer that does not transmit light, such as a light blocking member, may overlap the first component area EA1. The number of pixels per unit area (hereinafter referred to as resolution) of the pixels (hereinafter referred to as normal pixels) included in the display area DA and the number of pixels per unit area of the pixels included in the first component area EA1 (hereinafter referred to as first component pixels) may be the same as each other.

The second component area EA2 may include an area which is made of a transparent layer such that light may pass therethrough (hereinafter referred to as a light-transmitting area). The light transmitting area may not include a conductive layer or a semiconductor layer. For example, a layer including a light blocking material (e.g., a pixel defining layer and/or a light blocking member) may have a structure that does not block light due to an opening that overlaps the second component area EA2. The number of pixels per unit area of the pixels (hereinafter referred to as second component pixels) included in the second component area EA2 may be smaller than the number of pixels per unit area of normal pixels included in the display area DA. As a result, the resolution of the second component pixel included in the second component area EA2 may be lower than that of the normal pixel included in the display area DA.

The second non-display area PA2 may include a bending portion. The display area DA and the first non-display area PA1 may be flat and substantially parallel to a plane defined by the first direction DR1 and the second direction DR2. A side of the second non-display area PA2 may extend in a flat state, may pass through a bending portion (or may extend in a bent state), and then may extend in a flat state again. As a result, at least a portion of the second non-display area PA2 may be bent and assembled to be positioned on the rear side of the display area DA. Since at least a portion of the second non-display area PA2 overlaps the display area DA in plan view when assembled, the blocking area BBA of the display device 1000 may be reduced.

The driving unit 50 may be mounted on the second non-display area PA2 and may be mounted on the bending portion or may be positioned on a side of the bending portion. The driving unit 50 may be implemented as a chip.

The driving unit 50 may be electrically connected to the display area DA and the component area EA and may transmit electrical signals to pixels in the display area DA and the component area EA. For example, the driving unit 50 may provide data signals to the pixels PX disposed in the display area DA. In another example, the driving unit 50 may include a touch driving circuit and may be electrically connected to the touch sensor disposed in the display area DA and/or the component area EA. For example, the driving unit 50 may include various circuits in addition to the above-described circuits or may be designed to provide various electrical signals to the display area DA.

For example, the display device 1000 may have a pad part disposed at the end portion of the second non-display area (PA2), and may be electrically connected to a flexible printed circuit board (FPCB) including a driving chip through the pad part. For example, the driving chip positioned on the flexible printed circuit board may include various driving circuits for driving the display device 1000 or connectors for supplying power. According to embodiments, a rigid printed circuit board (PCB) may be used instead of a flexible printed circuit board.

The optical element ES may be disposed below the display panel DP. The optical element ES may include a first optical element ES1 overlapping the first component area EA1 and a second optical element ES2 overlapping the second component area EA2. The first optical element ES1 may use infrared light. In case that the first optical element ES1 uses infrared light, a layer (e.g., light blocking member), through which light does not transmit, may overlap the first component area EA1.

The first optical element ES1 may be an electronic element using light or sound. For example, the first optical element ES1 may include a sensor (e.g., infrared sensor) that receives and uses light, a sensor that outputs and detects light or sound to measure a distance or recognize a fingerprint, a small lamp that outputs light, and a speaker or the like that outputs sound. In the case of an electronic element using light, light of various wavelength bands such as visible light, infrared light, and ultraviolet light may be used.

The second optical element ES2 may include at least one of a camera, an infrared (IR) camera, a dot projector, an IR illuminator, and a Time-of-Flight (ToF).

The housing HM may be coupled to the cover window CW. The cover window CW may be disposed on the front surface of the housing HM. The housing HM may be coupled to the cover window CW to provide an accommodation space. The display panel DP and the optical element ES may be accommodated in the accommodating space provided between the housing HM and the cover window CW.

The housing HM may include a material having relatively high rigidity. For example, the housing HM may include frames and/or plates made of glass, plastic, or metal, or a combination thereof. The housing HM may stably protect components of the display device 1000, which are accommodated in the inner space, from external impact.

Figure 3:
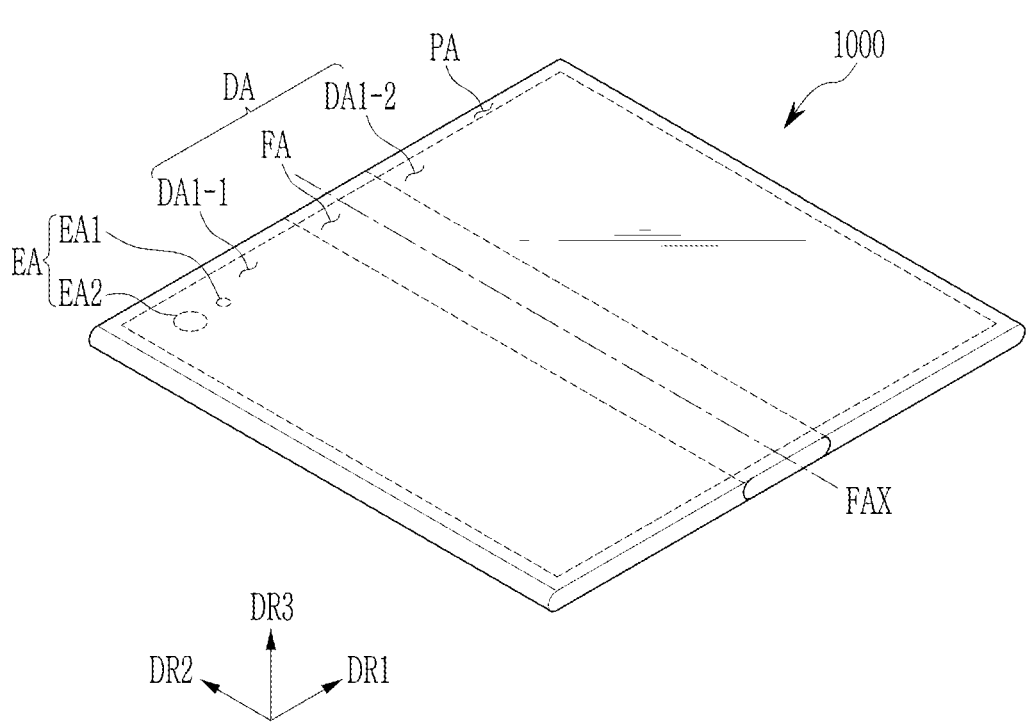
FIG. 3 is a schematic perspective view schematically illustrating a display device according to another embodiment.

Hereinafter, the structure of the display device 1000 according to another embodiment will be described through FIG. 3. FIG. 3 is a schematic perspective view schematically illustrating a light emitting display device according to an embodiment. A description of the components identical to those described above will be omitted for descriptive convenience, and the embodiment of FIG. 3 illustrates a foldable display device having a structure in which the display device 1000 is folded through a folding axis FAX.

Referring to FIG. 3, in an embodiment, the display device 1000 may be a foldable display device. The display device 1000 may be folded outward or inward with respect to the folding axis FAX. In case that the display device 1000 is folded outward with respect to the folding axis FAX, the display surface of the display device 1000 may be positioned on the outside in the third direction DR3 so that images may be displayed in directions (e.g., opposite directions). In case that the display device 1000 is folded inward with respect to the folding axis FAX, the display surface may not be visually recognized from the outside.

In an embodiment, the display device 1000 may include a display area DA, a component area EA, and a non-display area PA. The display area DA may be divided into a (1-1)th display area DA1-1, a (1-2)th display area DA1-2, and a folding area FA. The (1-1)th display area DA1-1 and the (1-2)th display area DA1-2 may be disposed on the left and right sides of the folding axis FAX, respectively, based on (or centered on), and folding area FA may be positioned between the (1-1)th display area DA1-1 and the (1-2)th display area DA1-2. For example, in case that the display device 1000 is folded outward based on the folding axis FAX, the (1-1)th display area DA1-1 and the (1-2)th display area DA1-2 may be disposed on sides (e.g., opposite sides) in the third direction DR3 and may display images in directions (e.g., opposite directions). For example, in case that the display device 1000 is folded inward with respect to the folding axis FAX, the (1-1)th display area DA1-1 and the (1-2)th display area DA1-2 may not be visually recognized from the outside.

Figure 4:
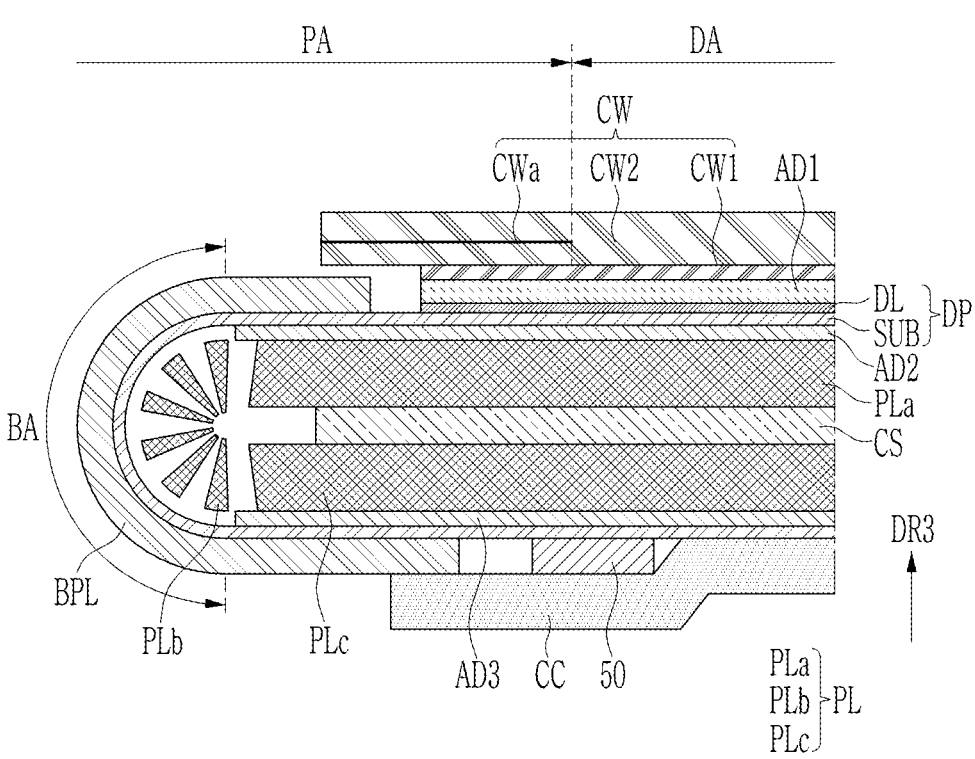
FIG. 4 is a schematic cross-sectional view illustrating a partial area of a display device according to an embodiment.
Figure 5:
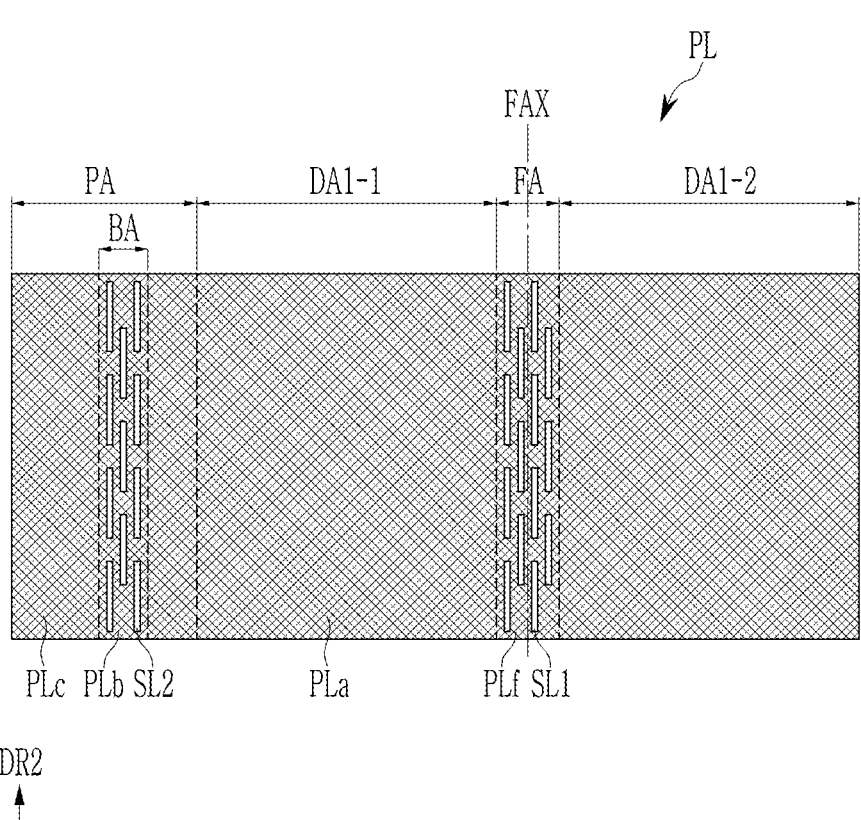
FIG. 5 is a schematic plan view of a support plate according to an embodiment.
Figure 6:
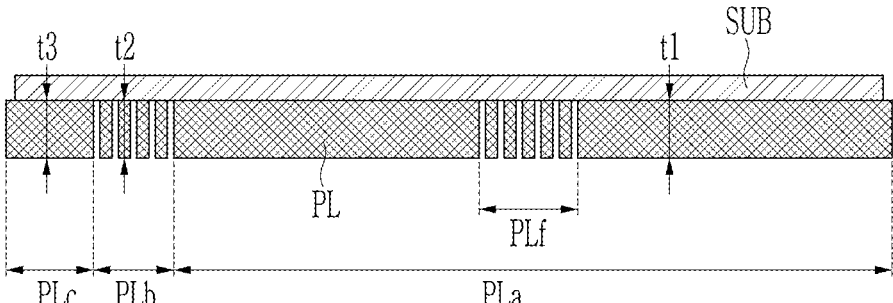
FIG. 6 is a schematic cross-sectional view of a support plate according to an embodiment.

Hereinafter, a display device 1000 according to an embodiment will be described with reference to FIGS. 4, 5, and 6. FIG. 4 is a schematic cross-sectional view illustrating a partial area of a display device 1000 according to an embodiment, FIG. 5 is a schematic plan view of a support plate PL according to an embodiment, and FIG. 6 is a schematic cross-sectional view of the support plate PL according to an embodiment.

FIG. 4 illustrates an area BA in which the substrate SUB is bent among the non-display area PA of the display panel DP according to an embodiment.

A cover window CW may be positioned above the display panel DP. The cover window CW may cover an upper portion of the display panel DP. The cover window CW may protect the upper surface of the display panel DP.

The cover window CW may include a base layer CW1 and a protective layer CW2. In an embodiment, the base layer CW1 may be made of a transparent material. For example, the base layer CW1 may include glass, a transparent synthetic resin, or the like. The base layer CW1 may include one or more layers.

The protective layer CW2 may be disposed on the upper surface of the base layer CW1 to prevent or minimize the occurrence of scratches on the base layer CW1. An opaque layer CWa may be disposed on a portion of the protective layer CW2. In an embodiment, the opaque layer CWa may be disposed on the edge portion of the protective layer CW2. The opaque layer CWa may block light. The opaque layer CWa may include a pattern that may be shown to a user in case that an image is not displayed.

The cover window CW may be coupled to the display panel DP by the first adhesive layer AD1. The first adhesive layer AD1 may be a transparent adhesive material such as a pressure sensitive adhesive (PSA) or an optically clear adhesive (OCA).

Referring to the schematic laminated structure of the display panel DP, the display panel DP may include a display layer DL and a touch sensing unit positioned on the display layer DL. The display layer DL may include a driving element layer, a light emitting element layer, and an encapsulation layer positioned on the substrate SUB.

The substrate SUB may be a base substrate or a base member. The substrate SUB may be a flexible substrate including a polymer resin such as polyimide, polyamide, or polyethylene terephthalate. The driving element layer may be positioned on the substrate SUB. The driving element layer may include transistors and capacitors constituting pixel circuit units that output driving currents to the light emitting elements. The driving element layer may include gate lines, data lines, power lines, gate control lines, fan-out lines connecting the display driver and the data lines, and lead lines connecting the display driver and display pads. The driving element layer may include transistors and capacitors constituting the gate driving unit, and gate control lines. The driving element layer may include conductive layers, semiconductor layers, and insulating layers, and a combination thereof may form and insulate transistors, capacitors, and signal lines.

The light emitting element layer may be positioned on the driving element layer and may include light emitting elements and light emitting regions corresponding to the light emitting elements. The light emitting device layer may include a pixel defining layer having openings defining light emitting regions.

The encapsulation layer (or referred to as a thin film encapsulation layer) may cover the top and side surfaces (or upper and side surfaces) of the light emitting element layer, and may prevent moisture or oxygen from penetrating into the light emitting element layer from the outside. The encapsulation layer may include one or more inorganic layers and one or more organic layers.

The touch sensing unit may be positioned on the encapsulation layer and may include sensing electrodes. The sensing electrodes may sense a user's touch in a mutual capacitor method and/or a magnetic capacitor method.

The substrate SUB according to an embodiment may include a bending area BA bent in the non-display area PA. The bending area BA may be bent such that a portion of the non-display area PA may be disposed on the rear surface of the display layer DL.

For example, a bending protection layer BPL may be disposed at a portion where the substrate SUB is bent to prevent cracking of the substrate SUB. The bending protection layer BPL may include, for example, a polymer resin such as polyethylene terephthalate (PET) or polyimide (PI).

A portion of the substrate SUB may be bent and positioned on the rear surface of the display panel DP. The driving unit 50 described above may be disposed in the portion of the substrate SUB. For example, the bending protection layer BPL, the driving unit 50 and the portion of the substrate SUB may be covered by the cover CC. The cover CC may be applied to cover at least a portion of the driving unit 50 and the flexible printed circuit board to protect them from electromagnetic interference (EMI) and electrostatic discharge (ESD). For example, the cover CC may prevent the driving unit 50 from directly contacting an external object, thereby protecting the driving unit 50 from physical damage caused by friction.

A support plate PL may be positioned below the substrate SUB. The support plate PL may include a material having high rigidity, and for example, copper, stainless steel (SUS), aluminum (Al), graphite, carbon fiber reinforced plastic (CFRP), glass fiber reinforced plastic (GFRP), glass, and the like. The carbon fiber reinforced plastic (CFRP) may be a plastic, which is made by impregnating carbon fiber (CF) with a resin and curing it. The glass fiber reinforced plastic (GFRP) may be a material that combines glass fiber with a thermosetting resin such as unsaturated polyester or epoxy resin. The support plate PL may protect the display panel DP during a manufacturing process of the display device 1000.

Referring to FIGS. 5, 6, and FIG. 4, the support plate PL may include a first region PLa disposed on the rear surface of the substrate SUB, a second region PLb overlapping the bending area BA, and a third region PLc overlapping the driving unit 50. The second region PLb may be positioned between the first region PLa and the third region PLc. For example, the second region PLb may be positioned on a side of the first region PLa, and the third region PLc may be positioned on a side of the second region PLb. The third region PLc may be disposed at an edge portion of the support plate PL.

The first region PLa, the second region PLb, and the third region PLc may have a flat plate shape having a rectangular shape in plan view. In an embodiment, the planar area of the first region PLa may be larger than the planar areas of the second and third regions PLb and PLc, but embodiments are not limited thereto. The first region PLa, the second region PLb, and the third region PLc may have the same thickness.

The second region PLb may include a second grid pattern (or second lattice pattern) SL2 overlapping the bending area BA so that the substrate SUB is readily bent in the bending area BA. For example, according to an embodiment, the first region PLa may include a metal folding area PLf where the display device 1000 overlaps the folding area FA. The metal folding area PLf may include a first grid pattern (or first lattice pattern) SL1 to readily bend the support plate PL in the folding area FA. The first grid pattern (or first lattice pattern) SL1 may be positioned in the middle of the first region PLa and the location of the first grid pattern (or first lattice pattern) SL1 may be determined according to the location of the folding area FA. However, embodiments are not limited thereto.

The first grid pattern (or first lattice pattern) SL1 and the second grid pattern (or second lattice pattern) SL2 may include slits penetrating the support plate PL in the third direction DR3. The slits may have a bar shape extending along the second direction DR2. Each of the slits may be spaced apart from each other to form a grid pattern (or lattice pattern). The first grid pattern (or first lattice pattern) SL1 and the second grid pattern (or second lattice pattern) SL2 may be readily folded by the slits.

In the display device 1000 according to an embodiment, a user may repeatedly switch between an unfolded state (e.g., first state) and a folded state (e.g., second state) based on the folding area FA. The first region PLa of the support plate PL may be repeatedly switched between a folded state and an unfolded state based on the first grid pattern (or first lattice pattern) SL1. For example, the second region PLb including the second grid pattern (or second lattice pattern) SL2 may be bent during the manufacturing process of the display device 1000, and may maintain the bent state regardless of folding and unfolding of the display device 1000.

The folding area FA of the support plate PL may continue to repeat the folding-unfolding state during use of the display device 1000 more than the bending area BA. Accordingly, the first grid pattern (or first lattice pattern) SL1 may have a slit shape more suitable for folding characteristics than the second grid pattern (or second lattice pattern) SL2.

For example, a first distance between adjacent first grid patterns (or first lattice patterns) SL1 in the folding area FA may be smaller than a second distance between adjacent second grid patterns (or second lattice patterns) SL2 in the bending area BA. The first distance and the second distance represent separation distances between grid patterns along the first direction DR1.

For example, the second width of the second grid pattern (or second lattice pattern) SL2 disposed in the bending area BA of the support plate PL may be greater than the first width of the first grid pattern (or first lattice pattern) SL1 disposed in the folding area FA. The first width and the second width represent widths of a grid pattern along the first direction DR1. In the folding area FA, the larger the area of the support plate PL supporting the substrate SUB is, the better the characteristics of supporting the substrate SUB are. Thus, the folding area FA may support the substrate SUB more stably, and the first width of the first grid pattern (or first lattice pattern) SL1 may be smaller than that of the second grid pattern (or second lattice pattern) SL2.

However, the shapes of the first grid pattern (or first lattice pattern) SL1 and the second grid pattern (or second lattice pattern) SL2 are not limited to those described above, and the shapes of the first grid pattern (or first lattice pattern)

SL1 and the second grid pattern (or second lattice pattern) SL2 may be changed or modified according to the needs of those skilled in the art, they may be formed differently or identically.

Referring to FIG. 6, the support plate PL according to an embodiment may protrude beyond the edge portion of the substrate SUB in the first direction DR1. The support plate PL may be attached to the substrate SUB during the manufacturing process to prevent the substrate SUB from colliding with other devices and being damaged during the manufacturing process.

FIG. 6 shows the support plate PL directly disposed on the rear side of the substrate SUB, but embodiments are not limited thereto. In another example, the substrate SUB and the support plate PL may be coupled by an adhesive layer. Referring to FIG. 4, the second adhesive layer AD2 according to an embodiment may be positioned between the substrate SUB and the first region PLa. The second adhesive layer AD2 may couple the substrate SUB and the first region PLa. For example, the third adhesive layer AD3 may be positioned between the substrate SUB and the third region PLc. The third adhesive layer AD3 may couple the substrate SUB and the third region PLc.

The second adhesive layer AD2 and the third adhesive layer AD3 may be spaced apart from each other in the third direction DR3. The second adhesive layer AD2 and the third adhesive layer AD3 may overlap along the third direction DR3.

A separate adhesive layer may not be positioned between the second region PLb and the substrate SUB. A separation space corresponding to the thickness of the second and third adhesive layers AD2 and AD3 may be disposed between the second region PLb and the substrate SUB.

According to an embodiment, the second region PLb and the substrate SUB may contact each other, but the second region PLb and the substrate SUB may simply be disposed in contact without being coupled to each other.

A buffer layer CS may be positioned between the first region PLa and the third region PLc. A separation space may exist between the buffer layer CS and the second region PLb.

The buffer layer CS may absorb an external shock to prevent damage to the display panel DP or the like. The buffer layer CS may include a material having elasticity, such as a sponge formed by foaming and molding rubber, a urethane-based material, or an acrylic-based material.

Although the specification shows the buffer layer CS disposed between the first region PLa and the third region PLc, the buffer layer CS is not limited thereto and according to embodiments, the buffer layer CS may be replaced with an adhesive layer or an air gap.

In the display device 1000 according to an embodiment, a support plate PL may be disposed on the rear surface of the display panel DP instead of a separate film. The support plate PL may reduce the inflow (or permeation) of impurities into the display panel DP during the manufacturing process, the occurrence of stamping during the process, or the generation of static electricity, and the process may be simplified and the impact resistance of the display device 1000 may be improved by replacing the film. For example, as the thickness of components disposed on the rear surface of the display panel DP is reduced, a slimmer display device may be implemented.

The support plate PL according to an embodiment may be coupled to a substrate SUB overlapping the display area, and may overlap the bending region without being coupled to the bending region. In case that the display panel DP slips, since the substrate SUB and the support plate PL are not coupled in the bending area BA, occurrence of defects such as buckling or cracking may be prevented.

Figure 7:
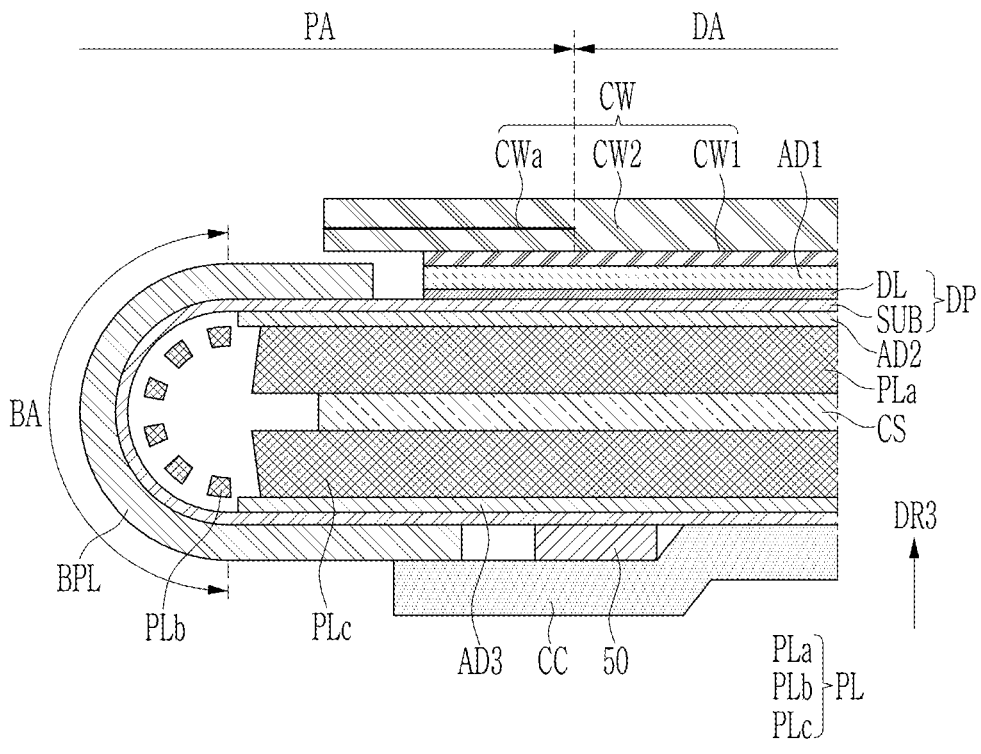
FIG. 7 is a schematic cross-sectional view of a partial area of a display device according to another embodiment.
Figure 8:
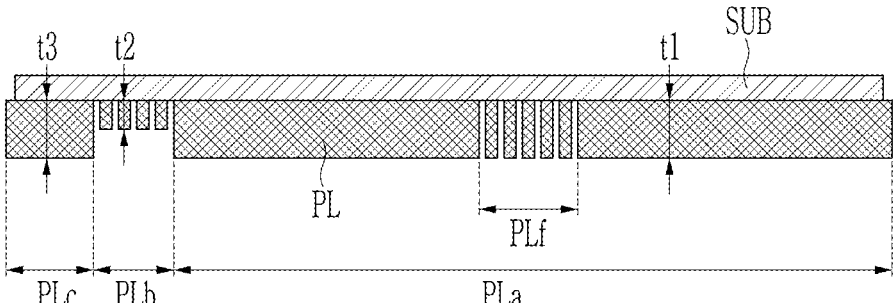
FIG. 8 is a schematic cross-sectional view of a support plate according to another embodiment.

Referring to FIG. 7 and FIG. 8, the support plate PL according to an embodiment may include a first region PLa overlapping the display layer DL, a second region PLb overlapping the bending area BA, and a third region PLc overlapping the driving unit 50. The second region PLb may include a second grid pattern (or second lattice pattern) SL2 overlapping the bending area BA. The second grid pattern (or second lattice pattern) SL2 may include slits penetrating the support plate PL in the third direction DR3.

The first region PLa may have a first thickness t1, the second region PLb may have a second thickness t2, and the third region PLc may have a third thickness t3. The second thickness t2 may be smaller than the first thickness t1 and the third thickness t3. The first thickness t1 and the third thickness t3 may be the same as each other. The second region PLb may be readily bent as the second region PLb is formed to have a thin thickness with improving the impact resistance of the bending area BA.

According to an embodiment, in case that the support plate PL is unfolded, the upper surface of the second region PLb may be positioned on the same plane as (or may be coplanar with) the upper surface of the first region PLa and the upper surface of the third region PLc. The second region PLb may have a recessed shape in cross sectional view compared to the first region PLa and the third region PLc.

Figure 9:
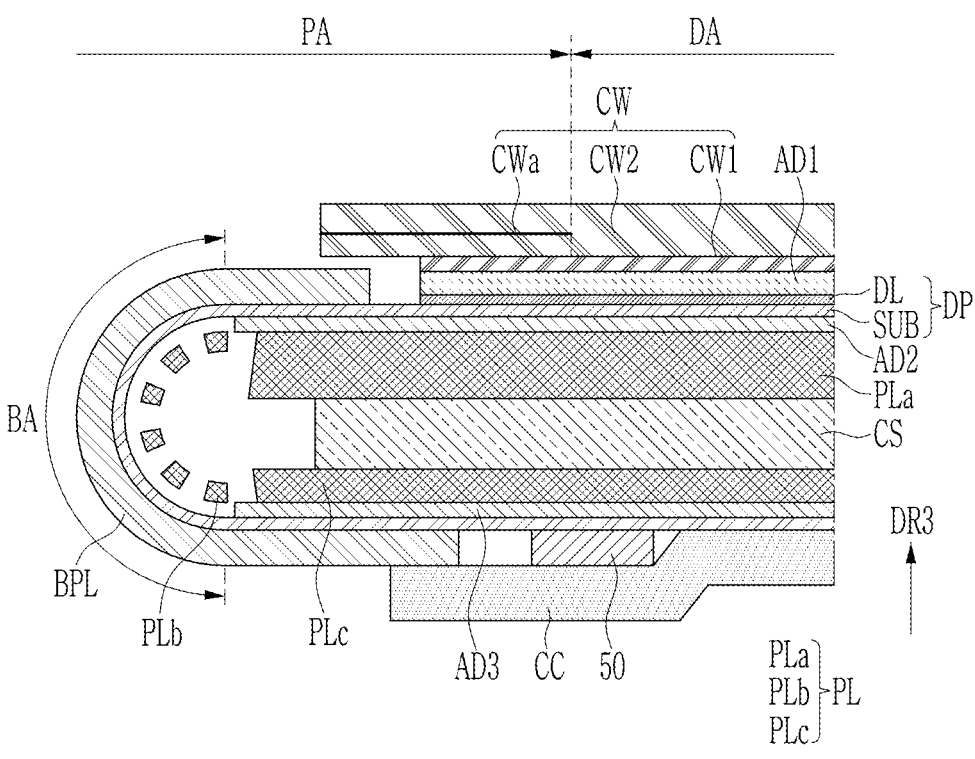
FIG. 9 is a schematic cross-sectional view of a partial area of a display device according to another embodiment.
Figure 10:
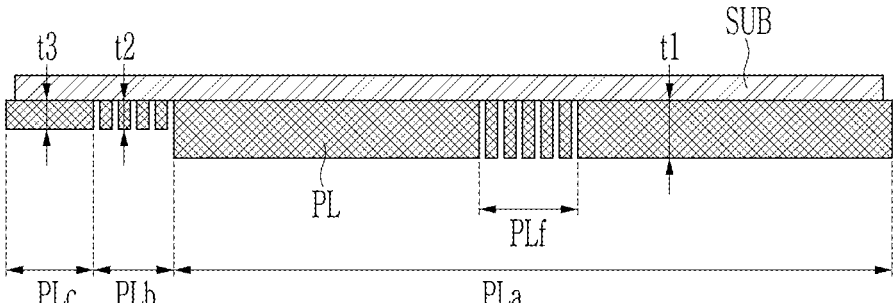
FIG. 10 is a schematic cross-sectional view of a support plate according to another embodiment.

Hereinafter, a display device 1000 according to another embodiment will be described with reference to FIGS. 9 and 10. FIG. 9 is a schematic cross-sectional view of a partial area of a display device 1000 according to another embodiment, and FIG. 10 is a schematic cross-sectional view illustrating a support plate PL according to another embodiment. Descriptions of components identical to those described above will be omitted for descriptive convenience.

Referring to FIG. 9 and FIG. 10, the support plate PL according to an embodiment may include a first region PLa overlapping the display layer DL, a second region PLb overlapping the bending area BA, and a third region PLc overlapping the driving unit 50. The second region PLb may include a second grid pattern (or second lattice pattern) SL2 overlapping the bending area BA. The second grid pattern (or second lattice pattern) SL2 may include slits penetrating the support plate PL in the third direction DR3.

The first region PLa may have a first thickness t1, the second region PLb may have a second thickness t2, and the third region PLc may have a third thickness t3. The second thickness t2 and the third thickness t3 may be smaller than the first thickness t1. The second thickness t2 and the third thickness t3 may be the same as each other. The first region PLa may protect the display panel DP disposed on the substrate SUB by being provided with a relatively thick thickness, and the second region PLb may be readily bent by being formed to have a thin thickness, with improving the impact resistance of the bending area BA. For example, since the third region PLc is provided with a relatively thin thickness, the thickness of the display device 1000 may be reduced.

According to an embodiment, in case that the support plate PL is unfolded, the upper surface of the second region PLb may be positioned on the same plane as (or may be coplanar with) the upper surface of the first region PLa and the upper surface of the third region PLc.

Figure 11:
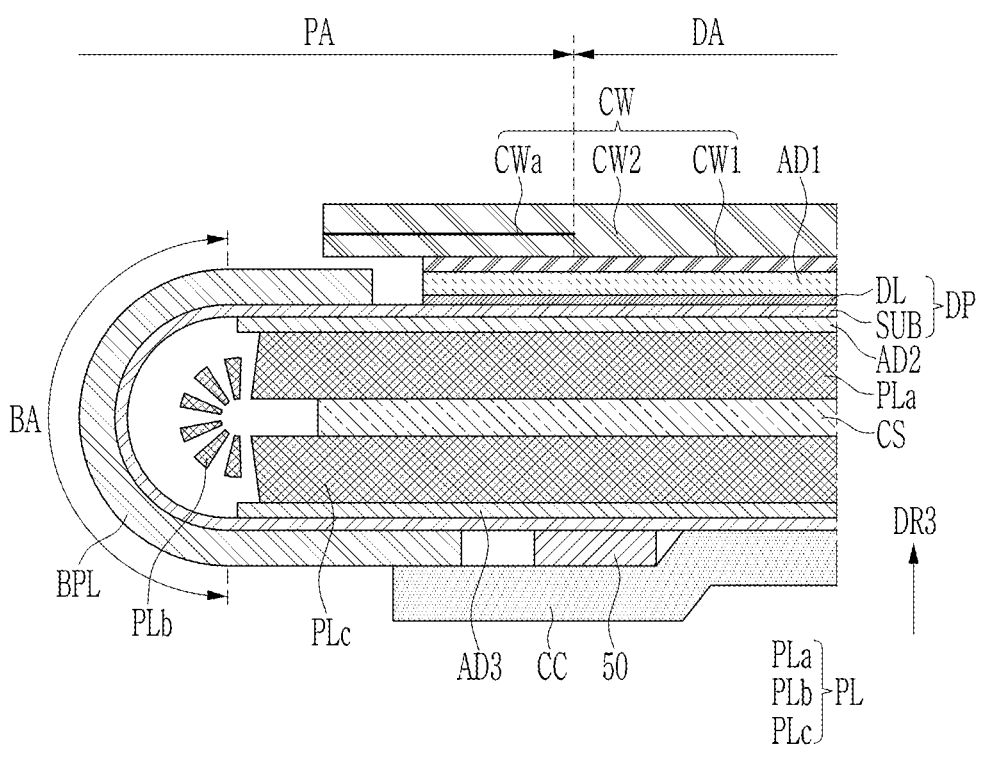
FIG. 11 is a schematic cross-sectional view of a partial area of a display device according to another embodiment.
Figure 12:
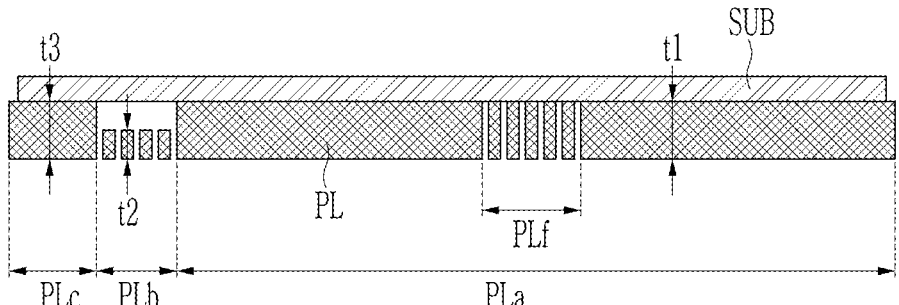
FIG. 12 is a schematic cross-sectional view of a support plate according to another embodiment.

Hereinafter, a display device 1000 according to another embodiment will be described with reference to FIGS. 11 and 12. FIG. 11 is a schematic cross-sectional view of a partial area of a display device 1000 according to another embodiment, and FIG. 12 is a schematic cross-sectional view illustrating a support plate PL according to another embodiment. Descriptions of components identical to those described above will be omitted for descriptive convenience.

Referring to FIG. 11 and FIG. 12, the support plate PL according to an embodiment may include a first region PLa overlapping the display layer DL, a second region PLb overlapping the bending area BA, and a third region PLc overlapping the driving unit 50. The second region PLb may include a second grid pattern (or second lattice pattern) SL2 overlapping the bending area BA. The second grid pattern (or second lattice pattern) SL2 may include slits penetrating the support plate PL in the third direction DR3.

The first region PLa may have a first thickness t1, the second region PLb may have a second thickness t2, and the third region PLc may have a third thickness t3. The first thickness t1 and the third thickness t3 may be the same as each other. The second thickness t2 may be smaller than the first thickness t1 and the third thickness t3.

The second region PLb may be readily bent as the second region PLb is formed to have a thin thickness with improving the impact resistance of the bending area BA. The second region PLb may be spaced apart from the bending area BA of the substrate SUB. The second region PLb may be disposed adjacent to the buffer layer CS. For example, in case that the support plate PL is unfolded, the lower surface of the second region PLb may be positioned on the same plane as (or may be coplanar with) the lower surfaces of the first region PLa and the third region PLc. In case that the support plate PL is unfolded, the upper surface of the second region PLb may be spaced apart from the substrate SUB, and a separation space may be formed between the substrate SUB and the second region PLb. As the separation space is formed, direct contact between the substrate SUB and the second region PLb may not occur. Thus, in case that the support plate PL is bent, an impact to the substrate SUB may be reduced.

Figure 13:
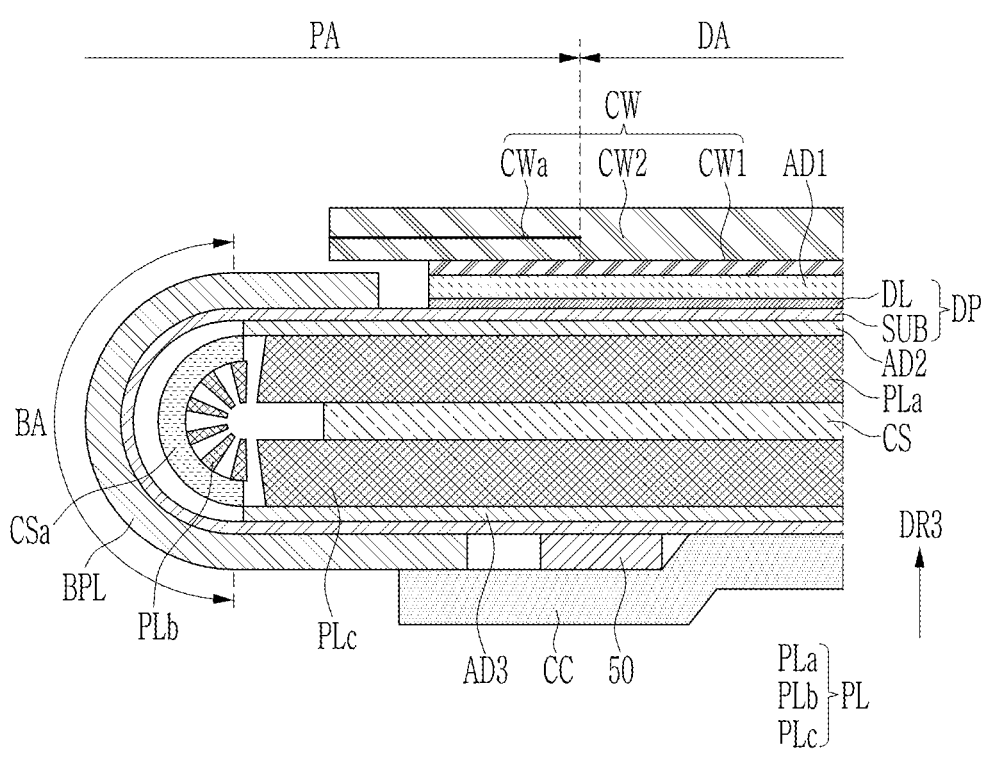
FIG. 13 is a schematic cross-sectional view of a partial area of a display device according to another embodiment.
Figure 14:
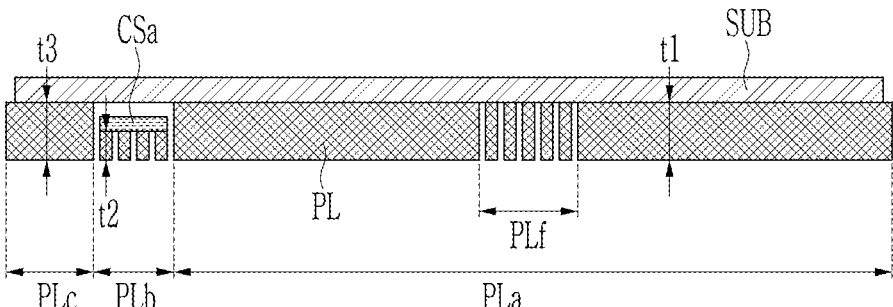
FIG. 14 is a schematic cross-sectional view of a support plate according to another embodiment.

Hereinafter, a display device 1000 according to another embodiment will be described with reference to FIGS. 13 and 14. FIG. 13 is a schematic cross-sectional view of a partial area of a display device 1000 according to another embodiment, and FIG. 14 is a schematic cross-sectional view illustrating a support plate PL according to another embodiment. Descriptions of components identical to those described above will be omitted for descriptive convenience.

Referring to FIG. 13 and FIG. 14, the support plate PL according to an embodiment may include a first region PLa overlapping the display layer DL, a second region PLb overlapping the bending area BA, and a third region PLc overlapping the driving unit 50. The second region PLb may include a second grid pattern (or second lattice pattern) SL2 overlapping the bending area BA. The second grid pattern (or second lattice pattern) SL2 may include slits penetrating the support plate PL in the third direction DR3.

The first region PLa may have a first thickness t1, the second region PLb may have a second thickness t2, and the third region PLc may have a third thickness t3. The first thickness t1 and the third thickness t3 may be the same as each other. The second thickness t2 may be smaller than the first thickness t1 and the third thickness t3. The second region PLb may be readily bent as the second region PLb is formed to have a thin thickness with improving the impact resistance of the bending area BA.

The second region PLb may be spaced apart from the bending area BA of the substrate SUB. The second region PLb may be disposed adjacent to the buffer layer CS. In case that the support plate PL is unfolded, the lower surface of the second region PLb may be positioned on the same plane as (or may be coplanar with) the lower surfaces of the first region PLa and the third region PLc. In case that the support plate PL is unfolded, the upper surface of the second region PLb may be spaced apart from the substrate SUB, and a separation space may be formed between the substrate SUB and the second region PLb.

The display device 1000 according to an embodiment may further include an auxiliary buffer layer CSa positioned between the substrate SUB and the second region PLb. The auxiliary buffer layer CSa may absorb external impact. The auxiliary buffer layer CSa may include a material having elasticity, such as a sponge obtained by foaming and molding rubber, a urethane-based material, or an acrylic-based material.

Figure 15:
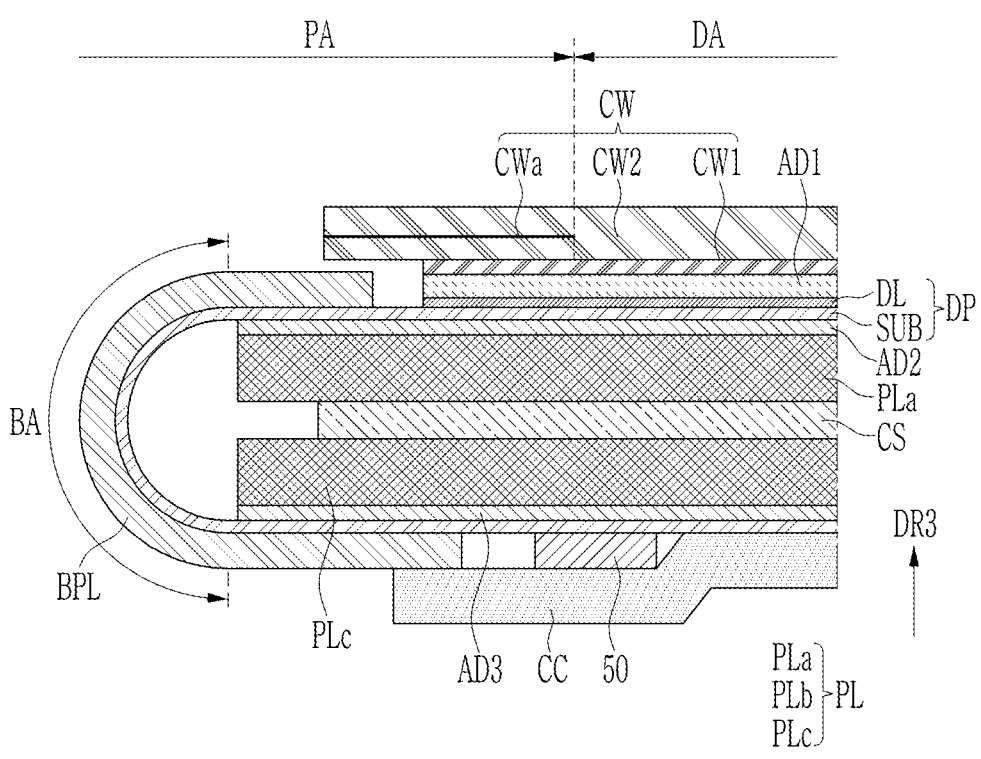
FIG. 15 is a schematic cross-sectional view of a partial area of a display device according to another embodiment.
Figure 16:
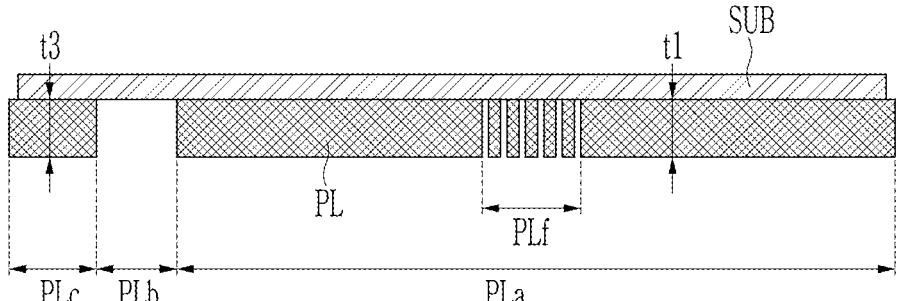
FIG. 16 is a schematic cross-sectional view of a support plate according to another embodiment.

Hereinafter, a display device 1000 according to another embodiment will be described with reference to FIG. 15 and FIG. 16. FIG. 15 is a schematic cross-sectional view of a partial area of a display device 1000 according to another embodiment, and FIG. 16 is a schematic cross-sectional view illustrating a support plate PL according to another embodiment. Descriptions of components identical to those described above will be omitted for descriptive convenience.

Referring to FIG. 15 and FIG. 16, the support plate PL according to an embodiment may include a first region PLa overlapping the display layer DL and a third region PLc overlapping the driving unit 50.

The support plate PL according to an embodiment may have a shape completely removed from the bending area BA. For example, the support plate PL may include a first region PLa and a third region PLc having the same thickness, and the first region PLa and the third region PLc may be spaced apart from each other.

Figure 17:
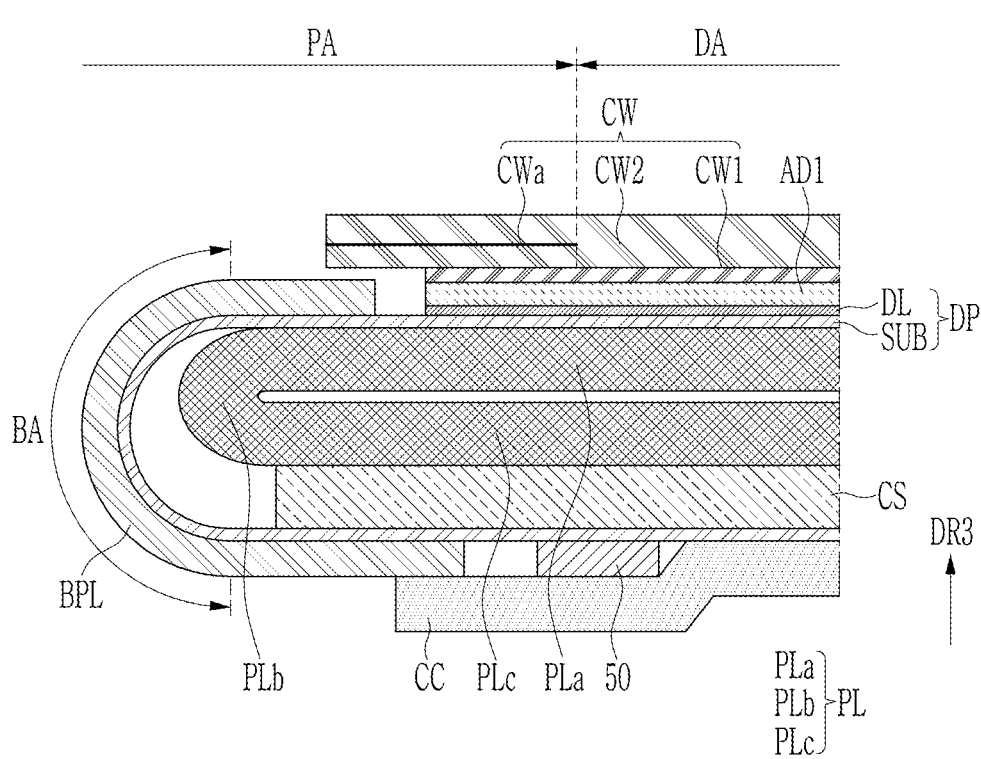
FIG. 17 is a schematic cross-sectional view of a partial area of a display device according to another embodiment.

Hereinafter, a display device 1000 according to another embodiment will be described with reference to FIG. 17. FIG. 17 is a schematic cross-sectional view of a partial area of a display device 1000 according to another embodiment. Descriptions of components identical to those described above will be omitted for descriptive convenience.

Referring to FIG. 17, the support plate PL according to an embodiment may have a structure in which a side is folded. The support plate PL may have a hemming structure to overlap the bending area BA. The support plate PL may include a first region PLa overlapping the display layer DL and a third region PLc positioned on the rear surface of the first region PLa and implementing a hemming structure. The first region PLa and the third region PLc may be connected by the second region PLb. A separation space may be formed between the first region PLa and the third region PLc. Impact resistance in the vicinity of the bending area BA may be improved by the support plate PL including the hemming structure.

The buffer layer CS according to an embodiment may be disposed below the support plate PL having a hemming structure. The buffer layer CS may be positioned between the lower surface of the support plate PL and the driving unit 50.

Although the specification shows an embodiment in which separate adhesive layers are not positioned between the support plate PL and the substrate SUB and between the support plate PL and the buffer layer CS, an adhesive layer may be positioned between them.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device, comprising:
a substrate including a display area and a non-display area;
a display layer disposed on the substrate and overlapping the display area; and
a support plate disposed under the substrate, wherein the support plate includes:
a first region disposed on a rear surface of the display layer;
a second region connected to the first region and including a lattice pattern; and
a third region connected to the second region and disposed on a rear surface of the first region, and
the second region is bent and overlaps a bending area of the non-display area of the substrate.

2. The display device of claim 1, wherein the bending area of the substrate and the second region of the support plate are not coupled to each other.

3. The display device of claim 1, wherein the bending area of the substrate and the second region of the support plate are spaced apart from each other.

4. The display device of claim 1, wherein the display device further includes an adhesive layer disposed between the first region of the support plate and the substrate and between the third region of the support plate and the substrate.

5. The display device of claim 1, wherein the display device further includes a buffer layer disposed between the first region and the third region of the support plate.

6. The display device of claim 1, wherein the first region, the second region, and the third region of the support plate have a same thickness.

7. The display device of claim 1, wherein a thickness of the second region of the support plate is smaller than a thickness of the first region of the support plate.

8. The display device of claim 7, wherein a thickness of the third region of the support plate is smaller than a thickness of the first region of the support plate.

9. The display device of claim 7, wherein the thickness of the second region and a thickness of the third region of the support plate are same as each other.

10. The display device of claim 7, wherein in a state in which the support plate is unfolded, an upper surface of the second region of the support plate is coplanar with an upper surface of the first region of the support plate and an upper surface of the third region of the support plate.

11. The display device of claim 7, wherein in a state in which the support plate is unfolded, a lower surface of the second region of the support plate is coplanar with a lower surface of the first region of the support plate and a lower surface of the third region of the support plate.

12. The display device of claim 7, wherein the display device further includes an auxiliary buffer layer disposed between the substrate and the second region of the support plate.

13. A display device comprising:
a substrate including a display area and a non-display area;
a display layer disposed on the substrate and overlapping the display area; and
a support plate disposed under the substrate, wherein the support plate includes:
a first region disposed on a rear surface of the display layer;
a second region connected to the first region and including a lattice pattern; and
a third region connected to the second region and disposed on a rear surface of the first region,
the first region of the support plate and the substrate are coupled by an adhesive layer,
the third region of the support plate and the substrate are coupled by the adhesive layer, and
a separation space is disposed between the second region of the support plate and the substrate.

14. The display device of claim 13, wherein the display device further includes a buffer layer disposed between the first region and the third region of the support plate.

15. The display device of claim 13, wherein the first region, the second region, and the third region of the support plate have a same thickness.

16. The display device of claim 13, wherein a thickness of the second region of the support plate is smaller than a thickness of the first region of the support plate.

17. The display device of claim 16, wherein a thickness of the third region of the support plate is smaller than a thickness of the first region of the support plate.

18. The display device of claim 16, wherein the thickness of the second region and a thickness of the third region of the support plate are same as each other.

19. The display device of claim 16, wherein in a state in which the support plate is unfolded, an upper surface of the second region of the support plate is coplanar with an upper surface of the first region of the support plate and an upper surface of the third region of the support plate.

20. The display device of claim 16, wherein in a state in which the support plate is unfolded, a lower surface of the second region of the support plate is coplanar with a lower surface of the first region of the support plate and a lower surface of the third region of the support plate.

* * * * *